United States Patent [19]

Fukinuki et al.

[11] 4,177,456
[45] Dec. 4, 1979

[54] DECODER FOR VARIABLE-LENGTH CODES

[75] Inventors: Takahiko Fukinuki, Kokubunji; Hiroshi Yoshigi, Hachioji, both of Japan

[73] Assignee: Hitachi, Ltd., Japan

[21] Appl. No.: 874,938

[22] Filed: Feb. 3, 1978

[30] Foreign Application Priority Data

Feb. 10, 1977 [JP] Japan .................................. 52/13925
Feb. 28, 1977 [JP] Japan .................................. 52/20210
Feb. 28, 1977 [JP] Japan .................................. 52/20211

[51] Int. Cl.² ......................................... H03K 13/243
[52] U.S. Cl. ........................................... 340/347 DD
[58] Field of Search ................. 340/347 DD; 358/261

[56] References Cited

U.S. PATENT DOCUMENTS

| | | | |
|---|---|---|---|
| 3,016,527 | 1/1962 | Gilbert | 340/347 DD |
| 3,051,940 | 8/1962 | Fleckenstein | 340/347 DD |
| 3,835,467 | 9/1974 | Woodrum | 340/347 DD |
| 3,883,847 | 5/1975 | Frank | 340/347 DD |
| 3,906,485 | 9/1975 | Hong | 340/347 DD |
| 3,925,780 | 12/1975 | Van Voorhis | 340/347 DD |

FOREIGN PATENT DOCUMENTS 2652459 11/1976 Fed. Rep. of Germany ........... 358/261

*Primary Examiner*—Charles D. Miller
*Attorney, Agent, or Firm*—Craig and Antonelli

[57] ABSTRACT

A decoder which decodes variable-length codes by the use of a logical circuit for conversion of the codes the construction of which is simplified. The decoder comprises a shift register which stores an input code therein, the logical circuit which converts the code signal of the shift register into a different code, a detector circuit which detects completion of the code conversion in the logical circuit, and means for inserting a predetermined code into the shift register on the basis of an output of the detector circuit.

4 Claims, 9 Drawing Figures

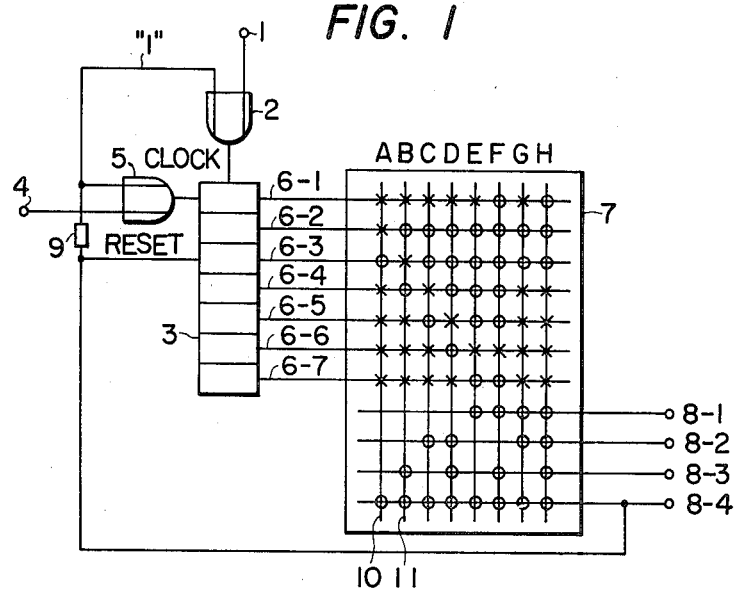
FIG. 1
FIG. 2
|   | FIXED LENGTH CODE | VARIABLE LENGTH CODE |
|---|---|---|
| A | 000 | 00 |
| B | 001 | 010 |
| C | 010 | 0110 |
| D | 011 | 01110 |
| E | 100 | 011110 |
| F | 101 | 011111 |
| G | 110 | 10 |
| H | 111 | 11 |
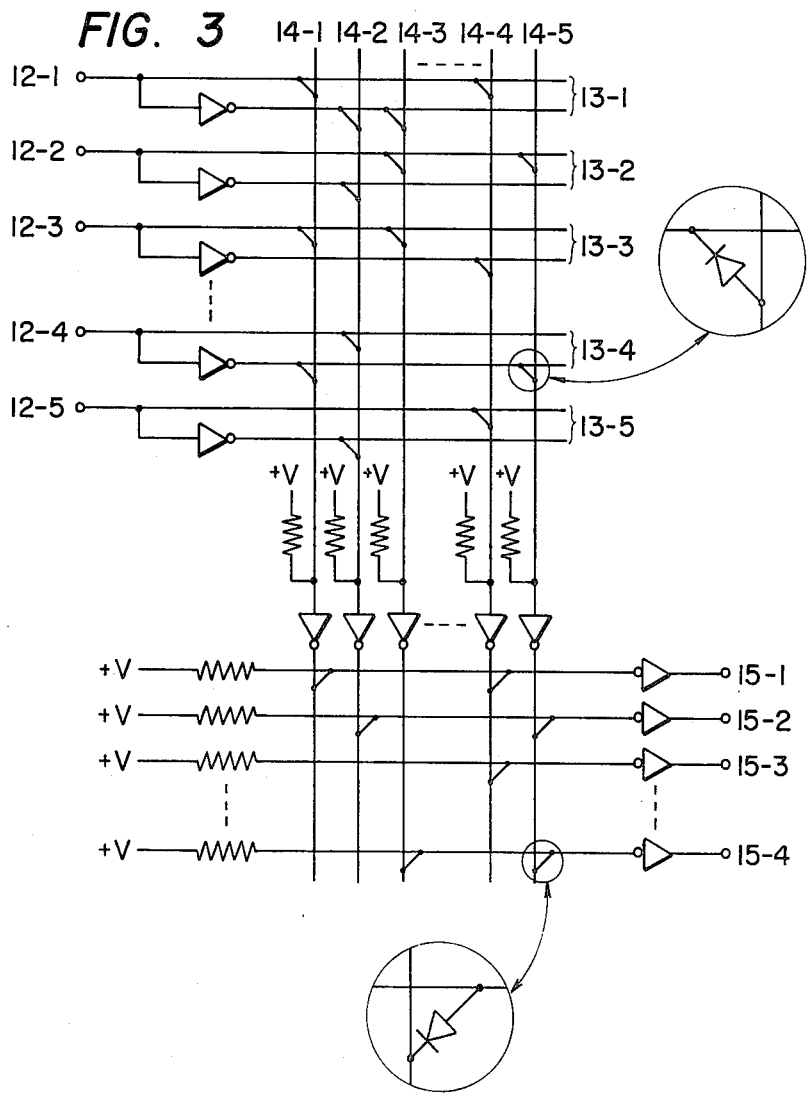
FIG. 3

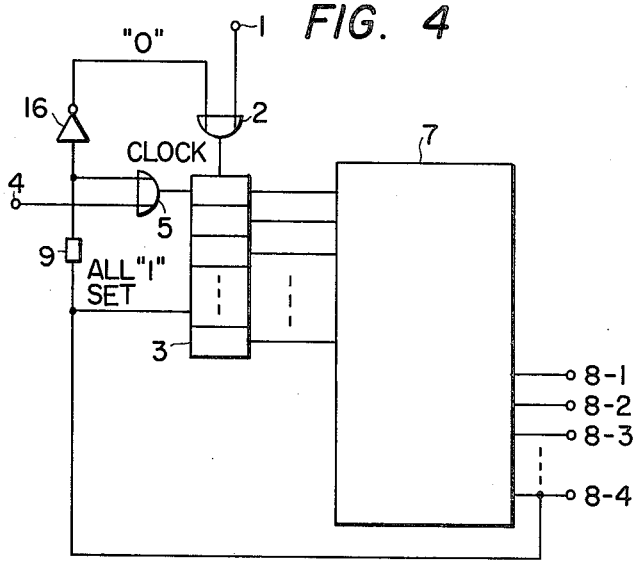
FIG. 4
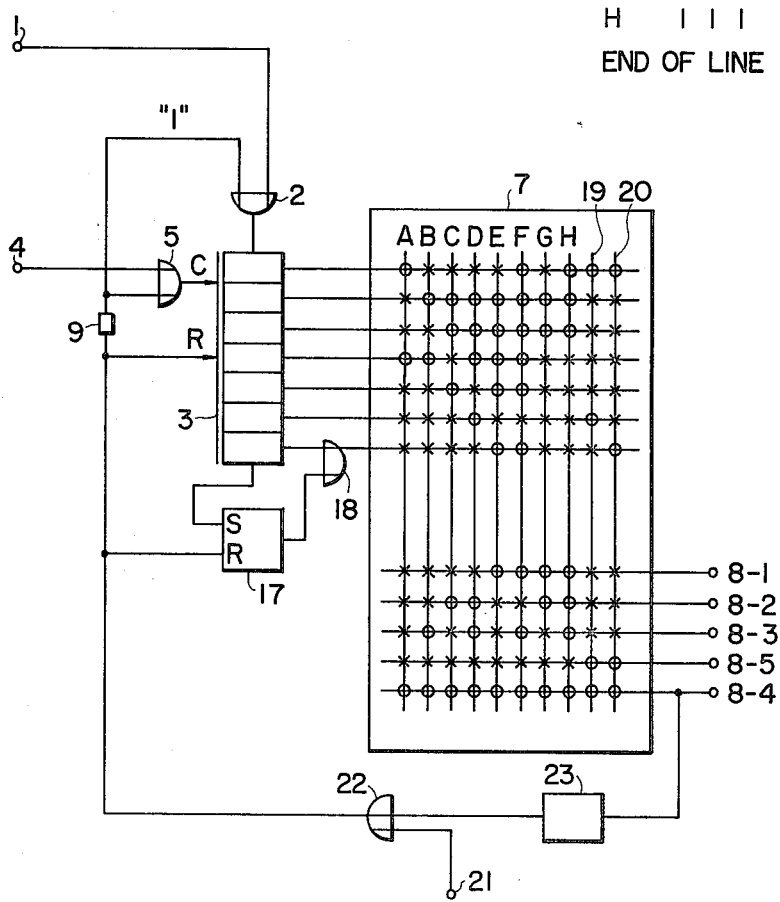
FIG. 5
FIG. 6
| | FIXED LENGTH CODE | VARIABLE LENGTH CODE |
|---|---|---|
| A | 000 | 001 |
| B | 001 | 010 |
| C | 010 | 0110 |
| D | 011 | 01110 |
| E | 100 | 011110 |
| F | 101 | 011111 |
| G | 110 | 10 |
| H | 111 | 11 |
| END OF LINE | | 000001 |

| | FIXED LENGTH CODE | VARIABLE LENGTH CODE W | VARIABLE LENGTH CODE B |
|---|---|---|---|
| A | 000 | 001 | 0110 |
| B | 001 | 010 | 001 |
| Ⓒ | 010 | 0110 | 010 |
| Ⓓ | 011 | 01110 | 01110 |
| Ⓔ | 100 | 011110 | 011110 |
| Ⓕ | 101 | 011111 | 011111 |
| G | 110 | 10 | 10 |
| H | 111 | 11 | 11 |

DECODER FOR VARIABLE-LENGTH CODES

BACKGROUND OF THE INVENTION (1) Field of the Invention

This invention relates to a decoder for variable-length codes of the type used in data transmission, facsimile transmission, etc.

(2) Description of the Prior Art

Variable-length codes are code signals, the numbers of bits of which are not constant. For example, they are codes for reducing the average number of necessary bits in the case of encoding information by converting a code of high frequency of occurrence into another code having a small number of bits and a code of low frequency of occurrence into another code having a large number of bits.

Such variable-length codes have the advantage that information can be transmitted in a smaller number of bits. In the case of decoding consecutive time-series code signals, however, a circuit for discerning the breaks of the respective codes is required. In general, therefore, the circuit arrangement becomes complicated. For this reason, there have been very few decoders for decoding code signals in which the number of bits constituting each code is quite free.

SUMMARY OF THE INVENTION

The principal object of this invention is to provide a decoder for variable-length codes which has a simple circuit arrangement.

Another object of this invention is to realize a decoder circuit for variable-length codes to which a logical circuit recently developed, such as a PLA (programmable logic array) and ROM (read only memory), is applicable.

Still another object of this invention is to realize a decoder which can decode variable-length codes including a plurality of different code trains, with a comparatively simple circuit.

In order to accomplish the objects of the invention, the decoder for variable-length codes according to this invention comprises a shift register into which a variable-length code train to be decoded is entered, a logical circuit for conversion which generates a predetermined logical output only when a predetermined logical pattern is entered into said shift register, means for detecting a predetermined bit output of the logical output pattern or a predetermined pattern output thereof and making it a "complete" signal and for resetting said shift register to a predetermined state by said "complete" signal, and means for inserting a predetermined "identify" code between the adjacent input codes of said shift register on the basis of the variable-length code train and the "complete" code.

The above-mentioned and other objects and features of this invention will become more apparent by reference to the following description taken in conjunction with the accompanying drawings.

BRIEF DESCRIPTION OF THE DRAWINGS

FIGS. 1, 4, 5, 7 and 8 are circuit diagrams each showing an embodiment of the decoder for variable-length codes according to this invention, FIGS, 2, 6 and 9 are tables showing the constructions of codes employed in the embodiments, and FIG. 3 is a circuit diagram for explaining the operating principle of a logical circuit for conversion used in the embodiments.

DESCRIPTION OF THE PREFERRED EMBODIMENTS

Figure 7:
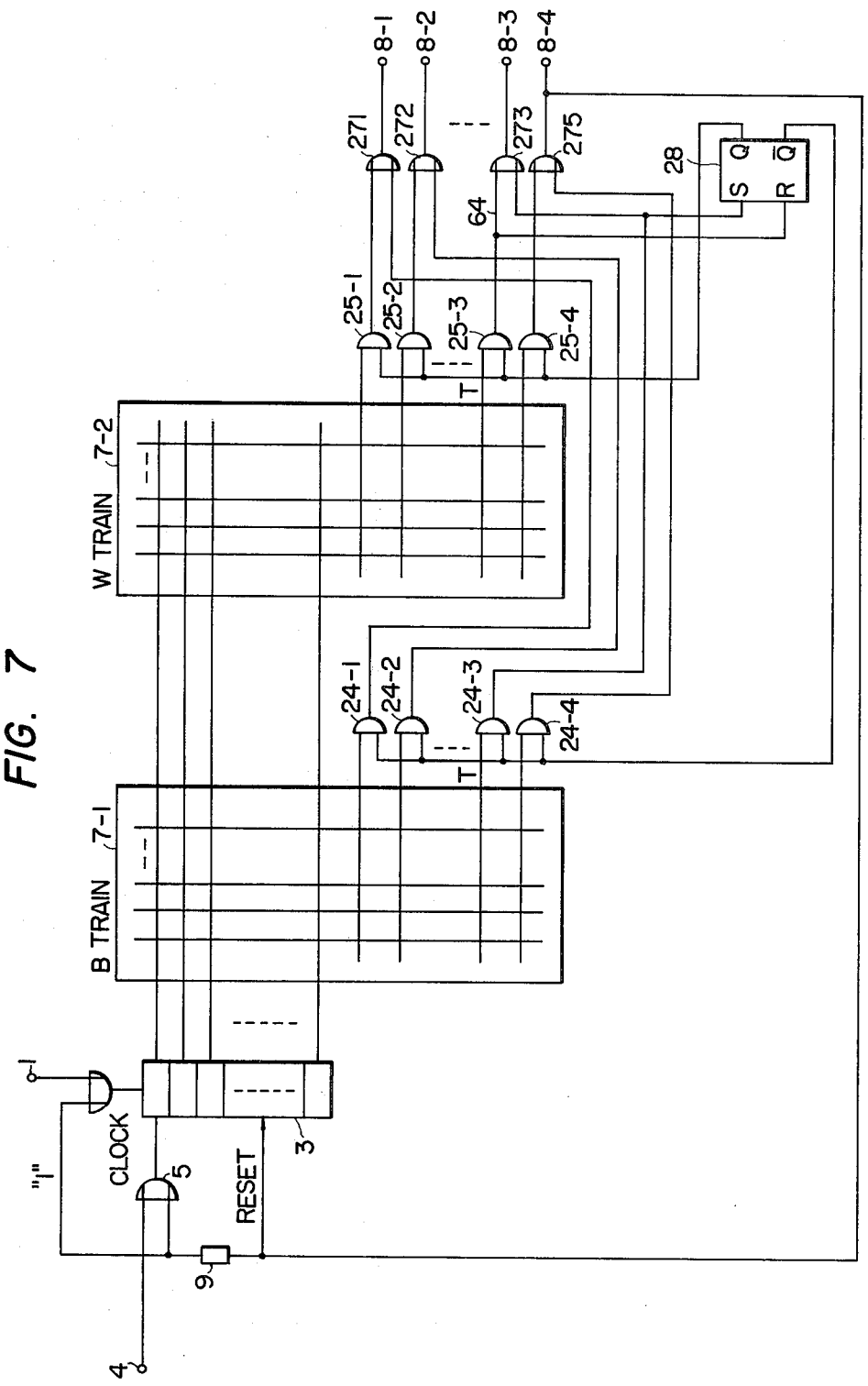

FIG. 1 is a block diagram which shows the construction of an embodiment of the decoder for variable-length codes according to this invention.

In the figure, numeral 1 designates an input terminal for variable-length codes to be decoded. For the sake of convenience of the description, examples of the variable-length codes are shown in FIG. 2. Equal-length (or fixed-length) codes of 3 bits are converted into variable-length codes of 2 to 6 bits. "A," "G" and "H" exhibiting high frequencies of occurrence are formed into codes having a small number of bits, while "E" and "F" exhibiting low frequencies of occurrence are formed into codes having a large number of bits.

The variable-length code applied to the input terminal 1 is transmitted via an OR gate 2 to a shift register 3. Bit signals stored in the shift register 3 are successively shifted downwards by clock signals which are impressed via a clock terminal 4 and an OR gate 5. The respective bit signals stored in the shift register are delivered to a logical circuit for conversion 7 via input lines 6-1, 6-2, ... and 6-7 in parallel.

FIG. 3 shows a PLA (programmable logic array) which exemplifies the logical circuit for conversion to be used in the following embodiments. The PLA is generally known, and can be utilized in the form of a single integrated circuit at present (see "PLAs enhance digital processor speed and cut component count" by George Reyling, Electronics/Aug. 8, 1974, pp. 109-114).

The arrangement and operation of the PLA will be briefly explained. As shown in the figure, the circuit comprises a plurality of input lines 13-1, 13-2, ... and 13-5 extending laterally and connected to input terminals 12-1, 12-2, ... and 12-5 respectively, a plurality of intermediate output lines 14-1, 14-2, ... and 14-5 extending vertically, and a plurality of output lines 15-1, 15-2, ... and 15-4 extending laterally at a lower part. Connective oblique lines indicated at the intersecting parts between the input lines or output lines extending laterally and the intermediate output lines extending vertically represent diode circuits as partly illustrated on a enlarged scale. When a specific logical pattern or code signal is applied to the input terminals 12-1, 12-2, ... and 12-5, an output appears at one of the intermediate output lines 14-1, 14-2, ... and 14-5, and a code signal corresponding thereto appears at the output lines 15-1, 15-2, ... and 15-5. That is, a matrix consisting of the intersecting parts between the input lines and the intermediate output lines forms an AND matrix circuit, and the intersecting parts between the intermediate output lines and the final output lines form an OR matrix, to carry out a predetermined logical pattern conversion or code conversion.

Referring back to FIG. 1, the logical circuit for conversion 7 is constructed on the basis of the same principle as illustrated in FIG. 3. Marks O indicate places where diodes are arranged, and marks X indicate places where diodes are arranged for NOT inputs.

When, by way of example, bit signals of "001" are stored in the shift register in the order from above, the intermediate output is generated only at an intermediate output line 10, and no intermediate output is generated at any other intermediate output line. Accordingly, bit signals "0001" are respectively generated at final output lines 8-1, 8-2, . . . and 8-4. When an output from the register is "0101," the intermediate output is generated only at an intermediate output line 11, and "0011" are generated at the final output lines. The final output lines 8-1, 8-2 and 8-3 provide the bit signals of the constant-length code decoded. On the other hand, the final output line 8-4 provides the output signal "1" when the output is generated at any of the intermediate output lines. This signal shall be hereinafter termed the "complete" signal. The "complete" signal is applied to the shift register and resets it. Via a delay circuit 9, part of the "complete" signal partially becomes the clock signal and is partially applied to the shift register 3 by the input OR gate 2. The delay time of the delay circuit 9 is set to be shorter than the period of the clock signal at the input terminal 4. Accordingly, immediately after one input code has been decoded, only the uppermost bit of the shift register 3 becomes "1" and the other bits are "0." The bit signal "1" shall be called the "identify" code. Thereafter, in synchronism with the clock signals applied from the clock input terminal 4, the respective bits of the next variable-length code are applied from the input terminal 1 until the intermediate output is provided.

Now, it is assumed by way of example that a train of input codes as shown in FIG. 2 is as follows:

| .....00 | 010 | 10 | 0110 |
|---|---|---|---|
| A | B | G | C |

It is also assumed that "1" is inserted into only the uppermost bit of the shift register before the inputting of A as described previously. When "001" preceded by the "identify" bit "1" is entered into the shift register, the equal-length code "000" into which the code A is decoded appears at the output lines 8-1, 8-2 and 8-3. Simultaneously, the "complete" signal is detected at the output line 8-4. By this signal, the shift register 3 has only the uppermost bit made "1" via the OR gate 2 and has the other bits reset to "0." Subsequently, similar operations are repeated for the codes B and G. Meantime, the code train of the shift register becomes:

| .....1001 | 010 | 1101 | 0110 ..... |
|---|---|---|---|
| A | B | G | C | and "000," "001," "110" and "010" are provided as decoded signals from the final output lines.

FIG. 4 is a circuit diagram showing the arrangement of another embodiment of the decoder according to this invention. In the figure, parts assigned the same symbols as in FIG. 1 have substantially the same functions and constructions, and hence, they are not explained repeatedly. In the present embodiment, when the "complete" signal has been detected from the output line 8-4, all the bits of the shift register 3 are set to "1," and "0" is inserted as the "identify" code into the head of each code. The signal "0" may be inserted through the OR gate 5 by using the output of the delay circuit 9 as the clock signal, and the inputting of the code train from the OR gate 2 may be inhibited. Naturally, the arrangement of the logical circuit for conversion is somewhat altered in correspondence therewith.

FIG. 5 is a circuit diagram which shows the arrangement of another embodiment of the decoder according to this invention. The present embodiment is effective in the case where code signals representative of breaks to be described hereunder are included in the variable-length code train.

For example, in the case of encoding and transmitting signals of a facsimile, a break signal called EOL (end of line) is entered into an information code as a signal which represents the termination of each scanning line. Since this break signal is also a kind of variable-length code, it is not essentially different from the ordinary variable-length codes. It is necessary, however, that the break signal is distinguished from the other information codes and that a meaningless dummy signal, etc., are included for the sake of convenience in the construction of the device. Therefore, the break signal is constructed of codes which never appear in the codes representative of ordinary information. As regards the decoding of the break signal, it is also considered to dispose an exclusive decoder separate from the decoder for the information codes.

In the present embodiment of this invention, both the information codes and the break signal can be decoded by a single decoder.

FIG. 6 shows the codes of information words A, B, . . . and H and a break signal which have been used in the present embodiment. In comparison with the case of FIG. 2, only the information code A and the break signal are different. The break signal has a pattern in which a bit signal "1" appears after five consecutive bit signals of "0." In this case, a condition that at least four "0"s continue is also allowed in practice. In many cases, however, the number of "0"s is taken somewhat in excess in order to facilitate and make reliable the construction of the device.

In the case where the variable-length code becomes too short and where there is no signal to be transmitted, the above "0"s are transmitted as dummy bits in a required number.

As is apparent from FIG. 5, the differences between the present embodiment from the embodiment of FIG. 1 are a flip-flop circuit 17, an OR gate circuit 18, and intermediate output lines 19 and 20 and an output line 8-5 in the logical circuit for conversion 7.

Regarding the decodings of the variable-length codes of the information words A, B, . . . and H, predetermined decoding are executed by the operations of the circuits assigned the same numerals as in FIG. 1. Where the variable-length code before the break signal has been decoded and where the "identify" code "1" has been applied to the shift register 3, the break signal enters the shift register 3 via the input terminal 1 and the OR gate 2. As a result, the following bit signals are stored in the shift register:

. . . 1000001 . . .

Although the number of "0"s is five here, it is sometimes six or more by the addition of the dummy code. When the decoder device is to begin operating, a "1" is entered from the terminal 21 separately for the reason described above.

In the case where the number of "0"s is five, an output is obtained at an intermediate output line 20 when the input has entered up to "1000001" into the shift register 3. In the case where the number of "0"s is six or more, no output issues at the intermediate output lines. A signal "1" is impressed on the set terminal of the flip-flop circuit 17 to set the flip-flop, and the resultant signal is impressed via the OR gate 18 on the logical circuit for conversion 7. Then, likewise to the case of the five "0"s, an output is obtained at the output line 20, and the break signal is detected from the final output line 8-5. Accordingly, the "complete" signal is obtained from the final output line 8-4 similarly to the general variable-length codes of the information A–H, whereupon predetermined operations for decoding variable-length codes subsequent to the break signal are initiated. That is, via the delay circuit 23 and the OR gate 22, part of the "complete" signal is applied to the reset terminal of the flip-flop circuit 17 to reset the flip-flop. Further, as in the case of the embodiment shown in FIG. 1, the "identify" code "1" is entered into the shift register by the OR gate 5 for the reset clock of the shift register and the OR gate 2 for the inputting. In the present embodiment, except that "001" is allotted to the code A, the other variable-length codes B–H are the same as in the case of FIG. 2.

In the present embodiment, it is possible that a flip-flop is disposed in preparation for a case of a long dummy code in order to detect the break code in the variable-length codes and that the break of the code which has become longer than the predetermined bit length of the shift register is detected.

FIG. 7 is a circuit diagram which shows the arrangement of another embodiment of the decoder according to this invention. In the present embodiment, two of the logical circuits for conversion are used.

The present embodiment is effective for a case where two code trains are involved. For example, in case where black and white levels have the "run lengths" encoded and are transmitted in a facsimile transmission equipment, the following time-series code signals are used:

$$\ldots W_{M1}\ W_{T1}\ B_{M2}\ B_{T2}\ W_{M3}\ W_{T3}\ B_{T4}\ldots$$

where W denotes the white level and B the black level, and suffixes M and T denote the upper bits and lower bits representative of the run length respectively. In case where the run length is short, it is sometimes the actual condition that M is not involved and that only T is involved.

In FIG. 7, the two logical circuits for conversion 7-1 and 7-2 are arranged. The operation of the logical circuit for conversion itself is the same as in FIG. 1. Signals from the shift register 3 are connected commonly to the input lines of both the logical circuits for conversion, and the final output lines of the respective logical circuits for conversion are taken out independently of each other. Outputs from these final output lines are combined by OR gate circuits 27-1, 27-2, ... 27-3 and 27-4 via AND gate circuits 24-1, 24-2, ... 24-3 and 24-4 driven by an output signal from the $\bar{Q}$ terminal of a flip-flop 28 to be described later and via AND gate circuits 25-1, 25-2, ... 25-3 and 25-4 driven by an output signal from the Q terminal of the same, respectively, and are derived as decoded signals.

The lowest ones of the final output lines of the logical circuits for conversion 7-1 and 7-2 are lines for detecting "complete" signals. The second-lowest output lines are lines for generating signals which signifies the foregoing code train T (the signal T also has the function of converting the codes W and B).

The flip-flop circuit 28 is set upon detection of the T train signal of the logical circuit for conversion 7-1, and is reset by the T train signal of the logical circuit for conversion 7-2. When it is set, it provides "1" at the output Q terminal and drives the AND gate circuits 25-1, 25-2, ... 25-3 and 25-4 so as to derive the outputs of the logical circuit for conversion 7-2. When it is reset, it provides "1" at the output $\bar{Q}$ terminal and enables the AND gate circuits 24-1, 24-2, ... 24-3 and 24-4 so as to derive the outputs of the logical circuit for conversion 7-1. The constructions and operations concerning the "complete" signal detecting portion and the portion for driving the shift register are the same as in the case of FIG. 1.

Thus, both the code trains B and W can be appropriately decoded.

Figures 8, 9:
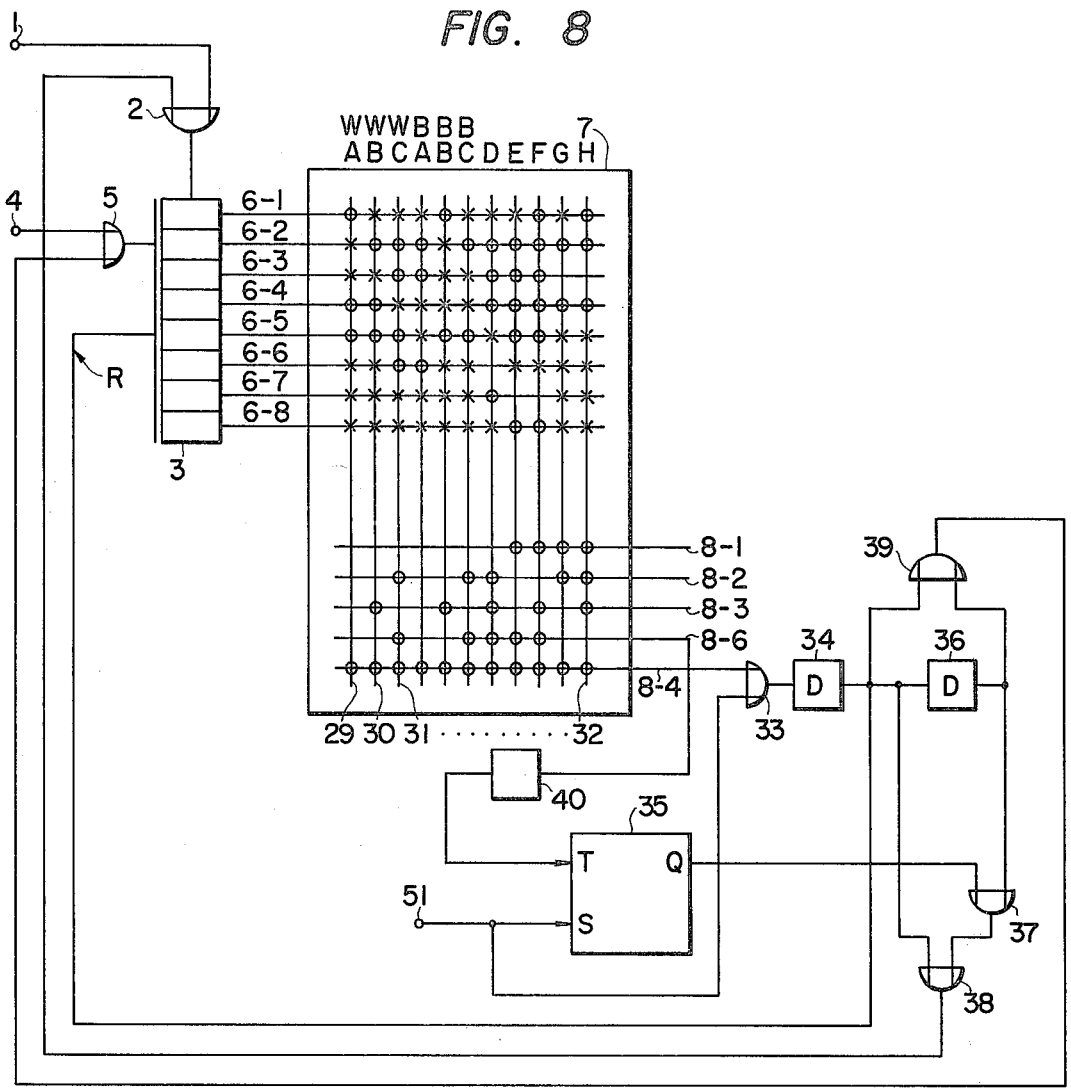

FIG. 8 shows the arrangement of another embodiment of the decoder for variable-length codes according to this invention. In the present embodiment, a plurality of trains of variable-length codes are decoded by a single logical circuit for conversion. In the previous embodiment in FIG. 7, the codes of the different trains are changed-over by the use of the plurality of gate circuits, whereas in the present embodiment, codes of different trains are discriminated in such a way that patterns of codes to be inserted into the input shift register at the breaks of the codes are made different.

FIG. 9 shows the constructions of variable-length codes used in the present embodiment. Two trains of codes of W train codes and B train codes are allotted to information words A, B, C, ... G and H. As seen from the figure, in cases of C, D, E and F, the change-over from the W train to the B train or from the B train to the W train becomes necessary. Although change-over codes need not be identical for the W train and the B train, a case where they are identical will be exemplified in the present embodiment for the sake of brevity of the description. In FIG. 8, circuits assigned the same symbols as in the preceding figures have substantially the same functions, and hence, a detailed explanation is omitted. In the logical circuit for conversion, the intersection points between the input lines and the intermediate output lines at which marks O and X are not given are the so-called "don't care."

Now, take as an example a case where a code train of $A_W\ C_W\ B_B\ D_B\ A_W$ as shown in FIG. 8 has been received, that is, a case where codes of

| $A_W$ | $C_W$ | $B_B$ | $D_B$ | $A_W$ |
|---|---|---|---|---|
| ..... 001 | 0110 | 001 | 01110 | 001 | have been transmitted.

As will be stated later, an "identify" code bit signal "11" is added to the head of the codes through the gate circuit 2. Accordingly, when the code "001" representative of the code $A_W$ has entered the shift register 3, "11001" is stored in the shift register 3. In consequence, an output appears at an intermediate output line 29 of the logical circuit for conversion 7. Thus, a decoded equal-length code "000" corresponding to $A_W$ is obtained at the output lines 8-1, 8-2 and 8-3. Simultaneously therewith, the "complete" signal "1" appears at the output line 8-4. If an output from a flip-flop circuit 35 is "1," time-series signals "11" are generated at an OR gate 38 by delay elements 34 and 36 (both of which have delay times shorter than the clock period of the variable-length codes) and an AND gate 37.

On the other hand, time-series signals "11" (P) are similarly generated at an OR gate 39. They are applied to the clock terminal of the shift register 3 through the OR gate 5.

Via an OR gate 33 and the delay element 34, part of the signal "1" of the output line 8-4 is applied to the reset terminal R of the shift register 3 and resets the shift register 3.

In the manner described above, the "identify" signal "11" is entered into the shift register 3, and subsequently, the variable-length code "0110" of the next code $C_W$ is applied to the shift register 3 bit by bit by the clock signals impressed from the OR gate 5. When bit signals stored in the shift register have become "110110," an output appears at the intermediate output line 31 corresponding to the code $C_W$. Then, an equal-length code "010" appears at the output lines 8-1, 8-2 and 8-3. That is, the variable-length code is decoded. At this time, an output "1" is also obtained at the output line 8-6. The output signal "1" of the output line 8-6 is applied to the trigger terminal T of the flip-flop circuit 35 via a delay element 40 and inverts the state of the flip-flop 35. Accordingly, an output at the output terminal Q becomes "0." As a result, time-series signals "10" are delivered to the OR gate 38, and they are entered into the reset shift register 3 in the same way as the foregoing case of the code $A_W$. Further, when the variable-length code "001" corresponding to the next code $B_B$ is entered, a signal "1000001" is stored in the shift register 3, and an equal-length code "001" as decoded is delivered to the output lines 8-1, 8-2 and 8-3.

As stated above, the "identify" codes different from each other are generated for the differing W train and B train, and they are entered into the shift register 3 from the OR gates 38 and 2, whereby the variable-length codes of the two different trains can be decoded.

While, in the above, this invention has been explained in connection with several embodiments, it is not restricted thereto, but it can be variously modified by fulfilling the requisites of the appended claims. By way of example, modifications stated below are possible.

(1) The output line 8-4 for detecting the completion has been disposed among the output lines of the logical circuit for conversion. However, if all the equal-length codes contain "1," the completion can be detected by letting each bit output of the equal-length code to pass through an OR gate.

(2) The logic signals "1" and "0" in the embodiments have two significances even in an identical construction, depending on whether they are viewed in the positive logic or in the negative logic. Such modifications which are possible in the ordinary designs of logical circuits ought to be covered within the scope of the claims of this invention.

(3) Although the case of the two trains of the W train and the B train has been referred to in the embodiments, this invention is also applicable to a case of variable-length codes of three or more trains including a further train or further trains.

(4) In case where a FIFO (first-in first-out) memory is used on the input side of the shift register, the clock signals to be impressed on the clock terminal 4 need not always be at equal intervals.

(5) The FIFO memory may be disposed between the logical circuit for conversion and the succeeding signal processor.

(6) If necessary, flip-flop circuits and gate circuits may be left to a general-purpose processor.

(7) The "identify" code to be entered into the shift register on the basis of the "complete" signal has been exemplified as being inserted into the head of the variable-length code. However, a shift register may be separately disposed, and a predetermined code may be set in advance.

(8) The embodiment shown in FIG. 5 has been exemplified as being applied to the break signal. However, it is also applicable to other long special codes. Further, the single flip-flop circuit 17 is not restrictive, but a plurality of flip-flop circuits may generally be provided.

(9) A plurality of logical circuits for conversion may be incorporated by merely combining them.

(10) The flip-flop circuit to be used is not restricted to the trigger type, but any type such as the set and reset type may be adopted.

(11) In the embodiment of FIG. 8, the codes differing in dependence on the variable-length code train are inserted subsequently to the code corresponding to the "complete" signal. By way of example, however, they can be separately entered into the logical circuit for conversion without entering them into the shift register.

In this case, the shift register becomes one stage shorter, and the output of the flip-flop 35 is directly applied to the input line 6. Among the diodes in the upper half portion of the logical circuit for conversion 7, the diodes of those bits of the intermediate output lines 29, 30, . . . and 32 which concern the sorts of the variable-length code trains are put together to the input line 6.

We claim:

1. A decoder for decoding variable-length codes comprising:
   an input to which a variable length code is to be applied;
   a shift register, coupled to said input, for receiving a variable length code applied thereto and storing said variable-length code;
   first means, coupled to the stages of said shift register, for converting the contents of said shift register into a fixed-length code as an output signal;
   second means, coupled to said first means, for detecting the completion of the code conversion operation carried out by said first means;
   third means, coupled to said second means, for causing said shift register to receive and store a prescribed code in response to said second means detecting said completion of the code conversion operation; and
   fourth means, coupled to the last stage of said shift register, for storing a signal representative of overflow from said last stage of said shift register and applying said signal to said first means.

2. A decoder according to claim 1, wherein said first means comprises a logic circuit having
   a plurality of input lines coupled to respective stages of said shift register,
   a plurality of intermediate lines arranged together with said input lines in the form of a matrix, and a plurality of output lines arranged together with said intermediate lines in the form of a matrix and, wherein AND gates are provided at selected intersections of said input lines and said intermediate lines, and OR gates are provided at selected intersections of said intermediate lines and said output lines.

3. A decoder according to claim 1, wherein said fourth means comprises a flip-flop circuit having a first input coupled to the output of the last stage of said shift register and a second input coupled to said second means, and an OR gate coupled to an output of said flip-flop and the last stage of said shift register, the output of said OR gate being coupled to said first means.

4. A decoder according to claim 2, wherein said fourth means comprises a flip-flop circuit having a first input coupled to the output of the last stage of said shift register and a second input coupled to said second means, and an OR gate coupled to an output of said flip-flop and the last stage of said shift register, the output of said OR gate being coupled to one of said input lines of said logic circuit.

* * * * *